(12) United States Patent
Fenouillet-Beranger et al.

(10) Patent No.: US 9,997,395 B2
(45) Date of Patent: Jun. 12, 2018

(54) FABRICATION METHOD OF A STACK OF ELECTRONIC DEVICES

(71) Applicant: COMMISSARIAT À L'ENERGIE ATOMIQUE ET AUX ENERGIES ALTERNATIVES, Paris (FR)

(72) Inventors: Claire Fenouillet-Beranger, Voiron (FR); Frédéric-Xavier Gaillard, Voiron (FR); Benoit Mathieu, Grenoble (FR); Fabrice Nemouchi, Moirans (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days. days.

(21) Appl. No.: 15/616,568

(22) Filed: Jun. 7, 2017

(65) Prior Publication Data
US 2017/0352583 A1 Dec. 7, 2017

(30) Foreign Application Priority Data
Jun. 7, 2016 (FR) ..................................... 16 55209

(51) Int. Cl.
*H01L 21/30* (2006.01)
*H01L 21/46* (2006.01)
(Continued)

(52) U.S. Cl.
CPC .... *H01L 21/76259* (2013.01); *H01L 21/2007* (2013.01); *H01L 21/76251* (2013.01); *H01L 33/0079* (2013.01)

(58) Field of Classification Search
CPC .......... H01L 21/76259; H01L 21/2007; H01L 21/76251; H01L 33/0079
See application file for complete search history.

(56) References Cited

U.S. PATENT DOCUMENTS 8,476,145 B2 * 7/2013 Or-Bach ............. H01L 21/6835
438/197
8,574,929 B1 11/2013 Or-Bach et al.
(Continued)

FOREIGN PATENT DOCUMENTS

WO 2010-018204 A1 2/2010

OTHER PUBLICATIONS

Föll, H. et al., "Formation and application of porous silicon", Materials Science and Engineering, R 39, 2002, pp. 93-141.
(Continued)

*Primary Examiner* — Sonya D McCall Shepard
(74) *Attorney, Agent, or Firm* — Oliff PLC (57) ABSTRACT

This method includes the following steps: a) providing a first structure successively including a substrate, an electronic device and a dielectric layer; b) providing a second structure successively including a substrate, an active layer, an intermediate layer, a first semiconducting layer and a porous second semiconducting layer; c) bonding the first and second structures by direct bonding between the dielectric layer and the porous second semiconducting layer; d) removing the substrate of the second structure so as to expose the active layer; e) adding dopants to the first semiconducting layer or to the active layer; f) irradiating the first semiconducting layer by a pulse laser so as to thermally activate the corresponding dopants.

16 Claims, 8 Drawing Sheets

(51) Int. Cl.
    *H01L 21/762*     (2006.01)
    *H01L 33/00*     (2010.01)
    *H01L 21/20*     (2006.01)

(56) References Cited

U.S. PATENT DOCUMENTS

2005/0082526 A1    4/2005    Bedell et al.
2015/0348945 A1    12/2015    Or-Bach et al.

OTHER PUBLICATIONS

Le Quéré, F. et al., "Chemical Mechanical Planarization of Mesoporous Silicon Layer", 2010, pp. 1-8.
Borrel, J. et al., "Considerations for Efficient Contact Resistivity Reduction via Fermi Level Depinning—Impact of MIS Contacts on 10nm Node nMOSFET DC Characteristics", Symposium on VLSI Technology Digest of Technical Papers, 2015, 8-1, pp. T116-T117.

* cited by examiner

FABRICATION METHOD OF A STACK OF ELECTRONIC DEVICES

FIELD OF THE INVENTION

The invention relates to the technical field of fabrication of a stack of electronic devices. As non-restrictive examples, an electronic device can be a transistor, a memory, a micro electromechanical system etc.

The invention finds its application in particular in very large-scale 3D integration (VLSI) by CoolCube™ technology in order to successively produce transistors, the top transistors being fabricated at low temperature (typically less than 500° C.).

STATE OF THE ART

A known state-of-the-art comprises the following steps:
$a_0$) providing a first structure successively comprising a substrate, an electronic device, and a dielectric layer (conventionally an oxide);
$b_0$) providing a second structure successively comprising a substrate, an active layer designed to form an electronic device, an intermediate layer (conventionally a buried oxide layer), a semiconducting layer designed to form a ground plane, and a dielectric layer (conventionally an oxide);
$c_0$) bonding the first and second structures by direct bonding between the dielectric layers;
$d_0$) removing the substrate of the second structure so as to expose the active layer;
$e_0$) adding dopants to the semiconducting layer or the active layer;
$f_0$) thermally activating the dopants introduced in step $e_0$).

In addition, the substrate of the second structure provided in step $b_0$) is conventionally covered by a $SiO_2$ layer.

When the dopants are added to the semiconducting layer, step $f_0$) of thermal activation of the dopants is important in order to obtain an efficient ground plane enabling for example adjustment of the threshold voltage of a transistor, and a reduction of the influence of the short channel effects of a transistor. Step $f_0$) of thermal activation of the dopants has to be executed with a thermal budget which does not impair the electronic device of the first structure. As a non-restrictive example, when the electronic device of the first structure is a planar transistor of Fully-Depleted Silicon on Insulator (FDSOI) type as described in the document by P. Batude and al, Symposium on VLSI Technology Advance Program, 2015, the maximal admissible thermal budget is about 500° C. for 5 h, 600° C. for 1 min, and 800° C. for 1 ms.

Step $f_0$) is advantageously executed by irradiating the semiconducting layer by means of a pulse laser via the active layer exposed in step $d_0$) so as to thermally activate the dopants and to form the ground plane. However, one drawback is the thermal diffusion of the heat produced by the pulse laser in step $f_0$), through the underlying oxide layers, which is liable to impair the electronic device of the first structure.

When the dopants are added to the active layer, step $f_0$) of thermal activation of the dopants is important in order to obtain for example a drain and a source of good quality when the electronic device is formed is a transistor. Step $f_0$) is advantageously executed by directly irradiating the active layer by a pulse laser. However, as in the previous case, one drawback is the thermal diffusion of the heat produced by the pulse laser in step $f_0$) through the underlying oxide layers, which is liable to impair the electronic device of the first structure.

SUMMARY OF THE INVENTION

The object of the invention is to either totally or partially remedy the above-mentioned drawback. For this purpose, the object of the invention is to provide a fabrication method of a stack of electronic devices, comprising the following steps:
a) providing a first structure successively comprising a substrate, an electronic device, and a dielectric layer;
b) providing a second structure successively comprising a substrate, an active layer designed to form an electronic device, an intermediate layer, a first semiconducting layer designed to form a ground plane, and a porous second semiconducting layer;
c) bonding the first and second structures by direct bonding between the dielectric layer and the porous second semiconducting layer;
d) removing the substrate of the second structure so as to expose the active layer;
e) adding dopants to the first semiconducting layer or the active layer;
f) irradiating the first semiconducting layer or the active layer by a pulse laser so as to thermally activate the corresponding dopants.

The method according to the invention thereby enables thermal diffusion of the heat produced by the pulse laser in step f) to be considerably reduced by means of the porous second semiconducting layer of the second structure provided in step b). Indeed, such a porous second semiconducting layer enables a good thermal isolation of the first electronic device to be obtained, or in other words, a good thermal separation between the first semiconducting layer and the first electronic device, or possibly, between the active layer and the first electronic device. When the dopants are added to the first semiconducting layer in step e), step f) is executed by irradiating the first semiconducting layer via the active layer exposed in step d). When the dopants are added to the active layer in step e), step f) is executed by directly irradiating the active layer. Furthermore, such a porous second semiconducting layer, due to the conferred thermal isolation, allows a certain latitude on the choice of the values of the parameters of the pulse laser such as the fluence or the duration of the pulses.

The method according to the invention can comprise one or more of the following features.

According to one feature of the invention, the porous second semiconducting layer presents a free surface in step b), and step b) comprises a step $b_1$) consisting in forming a dielectric layer on said free surface, the direct bonding being performed in step c) between the dielectric layer of the first structure and the dielectric layer formed in step $b_1$).

One advantage procured by the dielectric layer (for example an oxide layer) formed on the free surface of the porous second semiconducting layer is therefore the considerable decrease of the thermal conductivity of the porous second semiconducting layer, which enhances the thermal isolation between the ground plane and the first electronic device. For example purposes, a layer of oxidized porous silicon has a thermal conductivity about 30 times less than that of a non-oxidized porous silicon layer.

A further advantage procured by the dielectric layer (for example an oxide layer) formed on the free surface of the porous second semiconducting layer is to improve the bonding strength in step c) due to the fact that a more hydrophilic surface is obtained.

According to one feature of the invention, the dielectric layer formed in step $b_1$) is an oxide that is preferably a thermal oxide.

According to one feature of the invention, step b) is executed so that the porous second semiconducting layer presents a void ratio comprised between 20% and 80%, preferentially comprised between 40% and 80%.

Thus, one advantage procured by such a void ratio is to combine:
- a good thermal isolation between the first semiconducting layer and the first electronic device, or if applicable, between the active layer and the first electronic device, and
- a good mechanical strength of the stack of electronic devices.

According to one feature of the invention, the porous second semiconducting layer is made from porous silicon, the porous silicon preferably being n-doped. One advantage procured by a porous silicon is its relative simplicity of fabrication.

According to one feature of the invention, the porous second semiconducting layer presents a thickness comprised between 50 nm and 120 nm.

One advantage procured by such a thickness range (preferably combined with a void ratio comprised between 20% and 80%) is therefore to enable a satisfactory thermal isolation of the first electronic device to be obtained.

According to one feature of the invention, the substrate of the second structure is made from a semiconductor material, preferably silicon.

One advantage procured by such a substrate is to enable an electric contact allowing formation of the porous second semiconducting layer, for example by electrochemical means.

According to one feature of the invention, the dielectric layer of the first structure is made from silicon dioxide.

According to one feature of the invention, the dielectric layer of the first structure presents a thickness of more than 60 nm, preferably more than 80 nm.

One advantage procured by such a thickness range is therefore to contribute to a good thermal isolation of the first electronic device.

According to one feature of the invention, the dopants added to the first semiconducting layer in step e) are selected from the group containing B, In, P, and As.

According to one feature of the invention, the second structure provided in step b) comprises an etch stop layer inserted between the substrate of the second structure and the active layer.

One advantage procured by such an etch stop layer is thus to facilitate removal of the substrate of the second structure in step d) by etching.

According to one feature of the invention, the etch stop layer is made from SiGe, preferably n-doped SiGe.

According to one feature of the invention, the intermediate layer provided in step b) is etched after step d) in selective manner relatively to the active layer and to the first semiconducting layer, and a buried oxide layer is formed instead of and in place of the etched intermediate layer.

Selective removal of the intermediate layer is thus similar to the SON technology (SON standing for Silicon-On-Nothing) when the active layer is made from silicon.

According to one feature of the invention, the intermediate layer provided in step b) is made from SiGe preferably n-doped SiGe.

According to one feature of the invention, step e) consisting in adding the dopants to the first semiconducting layer is executed during step b) by in situ doping when formation of the first semiconducting layer takes place.

According to one feature of the invention, step e) consisting in adding the dopants to the first semiconducting layer is executed by adding the dopants to the first semiconducting layer via the active layer exposed during step d). Step e) is then preferentially executed by ion implantation.

BRIEF DESCRIPTION OF THE DRAWINGS

Other features and advantages will become apparent from the detailed description of different embodiments of the invention, the description being accompanied by examples and reference to the appended drawings.

Parts that are identical or perform the same function will bear the same reference numerals for the different embodiments, for the sake of simplification.

DETAILED DESCRIPTION OF EMBODIMENTS

Definitions

What is meant by "semiconducting" is that the layer presents an electric conductivity at 300 K comprised between $10^{-8}$ S/cm and $10^3$ S/cm.

What is meant by "dielectric" is that the layer presents an electric conductivity at 300 K that is lower than $10^{-8}$ S/cm.

What is meant by "direct bonding" is a spontaneous bonding resulting from two surfaces being placed in direct contact, i.e. in the absence of an additional element such as a glue, a wax or a brazing. The bonding is mainly the result of the Van der Waals forces resulting from the electronic interaction between the atoms or the molecules of the two surfaces, and of the hydrogen bonds on account of the surface preparations or of the covalent bonds established between the surfaces. Bonding by molecular adhesion is also referred to.

What is meant by "void ratio" is the ratio between the volume of the pores of the layer and the total volume of the layer.

The object of the invention is to provide a fabrication method of a stack of electronic devices 11 comprising the following steps:

a) providing a first structure 1 successively comprising a substrate 10, an electronic device 11, and a dielectric layer 12;
b) providing a second structure 2 successively comprising a substrate 20, an active layer 21 designed to form an electronic device, an intermediate layer 22, a first semiconducting layer 23 designed to form a ground plane, and a porous second semiconducting layer 240;
c) bonding the first and second structures 1, 2 by direct bonding between the dielectric layer 12 and the porous second semiconducting layer 240;
d) removing the substrate 20 of the second structure 2 so as to expose the active layer 21;
e) adding dopants to the first semiconducting layer 23 or to the active layer 21;
f) irradiating the first semiconducting layer 23 or the active layer 21 by a pulse laser L so as to thermally activate the corresponding dopants.

First Structure

Figure 1:
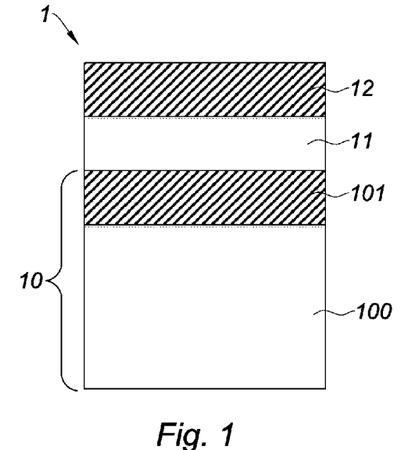
FIG. 1 is a schematic cross-sectional view of a first structure provided for implementation of a method according to the invention.

As illustrated in FIG. 1, the substrate 10 of the first structure 1 can comprise a support substrate 100 on which a dielectric layer 101 is formed. For non-restrictive example purposes, the support substrate 100 is made from silicon and the dielectric layer 101 is made from silicon dioxide. The dielectric layer 12 of the first structure 1 is preferentially made from silicon dioxide. The dielectric layer 12 of the first structure 1 advantageously presents a thickness of more than 60 nm, preferably more than 80 nm.

Figure 6:
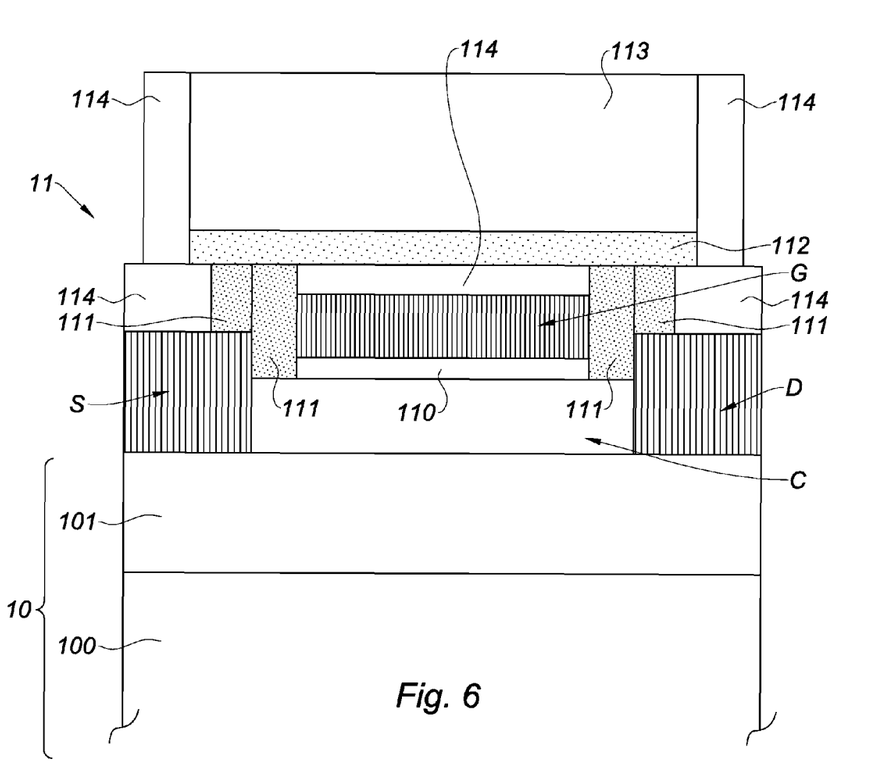
FIG. 6 is a schematic cross-sectional view illustrating an electronic device of transistor type able to belong to a bottom level for a VLSI integration.

As illustrated in FIG. 6, the electronic device 11 of the first structure 1 can be a MOSFET transistor (MOSFET standing for metal-oxide-semiconductor field-effect transistor). Such an electronic device 11 can comprise:
a source S, a drain D, and a gate G forming the electrodes of the transistor,
contacts 114 extending from said electrodes S, D, G,
a gate oxide layer 110 separating the channel C from the gate G,
spacers 111 made from dielectric material (for example SiN), arranged on each side of the gate G to separate the gate G from the source S and drain D, in order to prevent short-circuiting,
a nitride layer 112 and an oxide layer 113 extending above the gate G and spacers 111 so as to prevent short-circuiting of the contacts 114.

Such an electronic device 11 advantageously comprises interconnection levels (not shown) between the oxide layer 113 and dielectric layer 12.

Second Structure

Figure 2A:
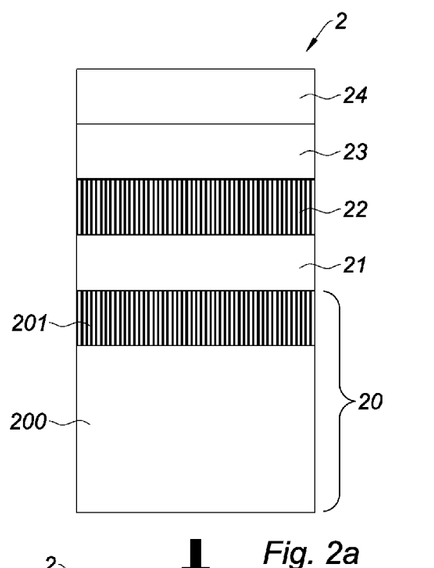
FIGS. 2a to 2c are schematic cross-sectional views illustrating preparation of a second structure provided for implementation of a method according to the invention.
Figure 2B:
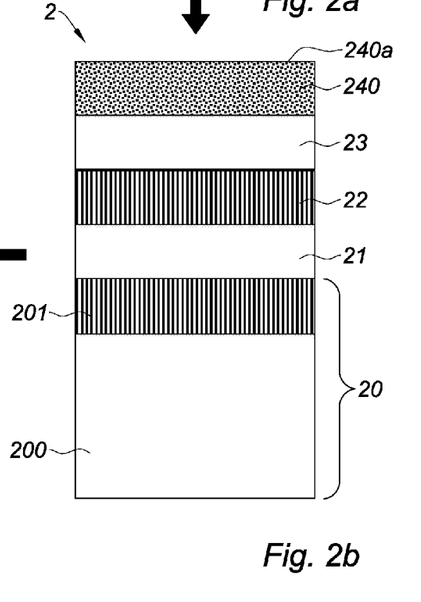
Figure 2C:
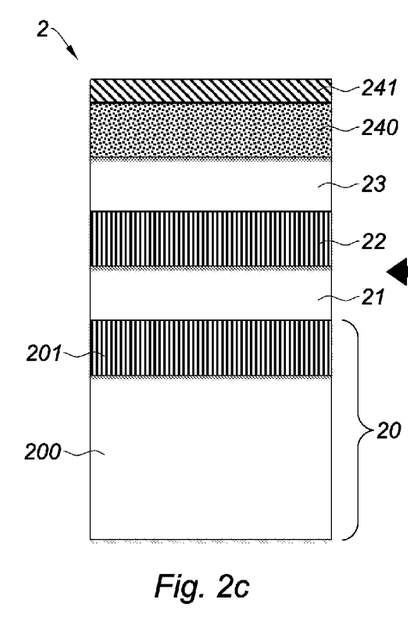
Figure 3:
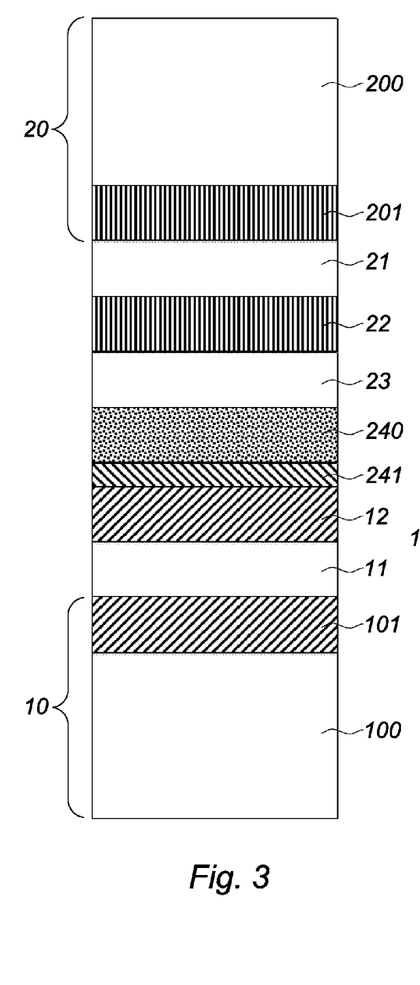
FIG. 3 is a schematic cross-sectional view illustrating bonding of the first and second structures.

As illustrated in FIGS. 2a to 2c, the substrate 20 of the second structure 2 can comprise a support substrate 200 on which an etch stop layer 201 is formed. The etch stop layer 201 is located between the support substrate 200 of the second structure 2 and the active layer 21. The etch stop layer 201 is preferentially made from SiGe, more preferentially from n-doped SiGe, with a dopant concentration preferentially lower than $10^{16}$ cm$^{-3}$. The etch stop layer 201 preferentially presents a thickness comprised between 10 nm and 20 nm. The support substrate 200 of the second structure 2 is advantageously made from a semiconductor material, preferably silicon.

The active layer 21, intermediate layer 22 and first semiconducting layer 23 can be successively formed on the etch stop layer 201 by epitaxy. The active layer 21 is preferentially made from silicon.

The active layer 21 advantageously presents a thickness comprised between 5 nm and 40 nm, more preferentially comprised between 10 nm and 20 nm.

The intermediate layer 22 provided in step b) is preferentially made from SiGe, more preferentially from n-doped SiGe. The intermediate layer 22 preferentially presents a thickness comprised between 10 nm and 20 nm.

The first semiconducting layer 23 is preferentially made from silicon. The first semiconducting layer 23 preferentially presents a thickness comprised between 20 nm and 30 nm.

Porous Second Semiconducting Layer

Step b) is advantageously executed so that the porous second semiconducting layer 240 presents a void ratio comprised between 20% and 80%, preferentially comprised between 40% and 80%. The porous second semiconducting layer 240 is preferentially made from porous silicon, the porous silicon more preferentially being n-doped, with a dopant concentration preferentially higher than $5 \times 10^{18}$ cm$^{-3}$. The porous second semiconducting layer 240 preferentially presents a thickness comprised between 50 nm and 120 nm. The porous second semiconducting layer 240 presents a free surface 240a in step b) (as illustrated in FIG. 2b). As illustrated in FIG. 2c, the method advantageously comprises a step b$_1$) consisting in forming a dielectric layer 241 on the free surface 240a of the porous second semiconducting layer 240. The dielectric layer 241 formed in step b$_1$) is preferentially an oxide, more preferentially a thermal oxide.

As a non-restrictive example, the porous second semiconducting layer 240 can be formed from a crystalline silicon layer 24 (illustrated in FIG. 2a) epitaxied on the first semiconducting layer 23. To do this, the porous second semiconducting layer 240, made from porous silicon, can be obtained by electrochemical or photo-electrochemical means. More precisely, the second semiconducting layer 240 can be obtained by anodic dissolution of the crystalline silicon layer 24 in a solution comprising hydrofluoric acid (HF). The concentration of HF in the solution can typically vary between 1% and 50%. The current density can typically vary between a few mA/cm$^2$ and a few A/cm$^2$. As explained previously, the support substrate 200 of the second structure 2 is advantageously made from a semiconductor material, preferably silicon, in order to enable an electric contact allowing formation of the porous second semiconducting layer 240 by electrochemical or photo-electrochemical means. For example purposes, when the support substrate 200 of the second structure 2 is strongly p-doped or n-doped so that the resistivity of the support substrate 200 is less than or equal to a few tens of mΩ·cm, it is then possible to form porous silicon directly by anodization of the crystalline silicon layer 24 without requiring illumination.

Examples of experimental conditions for formation of porous silicon are particularly described in the document H. Foll et al, "*Formation and application of porous silicon*", Materials Science and Engineering, 39 (2002), 93-141.

Furthermore, the porous silicon can be divided into 3 categories according to the diameter of the pores:
microporous for pore diameters of less than 2 nm,
mesoporous for pore diameters comprised between 2 nm and 50 nm,
macroporous for pore diameters of more than 50 nm.

The morphological characteristics of porous silicon (pore size, void ratio, thickness) depend on the experimental conditions, in particular the HF concentration, the current density, the nature of the support substrate 200 and the anodization time. In particular, it is possible to arrange suitable experimental conditions to form a porous second semiconducting layer 240 with a thickness strictly larger than 120 nm, and to then perform Chemical Mechanical Polishing (CMP) in order to achieve a thickness comprised between 50 nm and 120 nm. The use of microporous will be preferred when the porous second semiconducting layer 240 presents a thickness comprised between 50 nm and 120 nm.

Bonding

When a dielectric layer 241 is formed on the free surface 240a of the porous second semiconducting layer 240, direct bonding takes place in step c) between the dielectric layer 12 of the first structure 1 and the dielectric layer 241 formed in step $b_1$).

Step c) can comprise a prior step consisting in planarizing the surface of the dielectric layer 12 of the first structure 1 and/or the surface of the dielectric layer 241 formed in step $b_1$). This prior step is for example performed by means of Chemical Mechanical Polishing (CMP).

Removal of the Substrate of the Second Structure

Step d) preferentially comprises a grinding step of the support substrate 200 followed by an etching step of the remaining part of the support substrate 200, for example with a tetramethylammonium hydroxide (TMAH). Finally, the etch stop layer 201 is etched, preferentially by wet etching means.

Doping in the First Semiconducting Layer: Formation of the Ground Plane

The dopants which may be added to the first semiconducting layer 23 in step e) preferentially comprise:
  p-type dopants such as boron or indium, and
  n-type dopants such as phosphorus or arsenic.

The p-type and n-type dopants advantageously present a concentration comprised between $2 \times 10^{18}$ cm$^{-3}$ and $5 \times 10^{18}$ cm$^{-3}$.

Step e) can be executed during step b) by in situ doping when formation of the first semiconducting layer 23 takes place.

Step e) can also be executed by adding the dopants via the active layer 21 exposed in step d). Step e) is then preferentially executed by ion implantation. For example, for phosphorus, the dose is about $10^{13}$ cm$^{-2}$, the energy is about 25-35 keV and the angle of attack is 15°. For boron, the dose is about $10^{13}$ cm$^{-2}$, the energy is about 15 keV and the angle of attack is 15°. For indium, the dose is about $10^{13}$ cm$^{-2}$, the energy is about 80 keV and the angle of attack is zero. Such parameters prevent amorphization of the active layer 21.

Figure 4A:
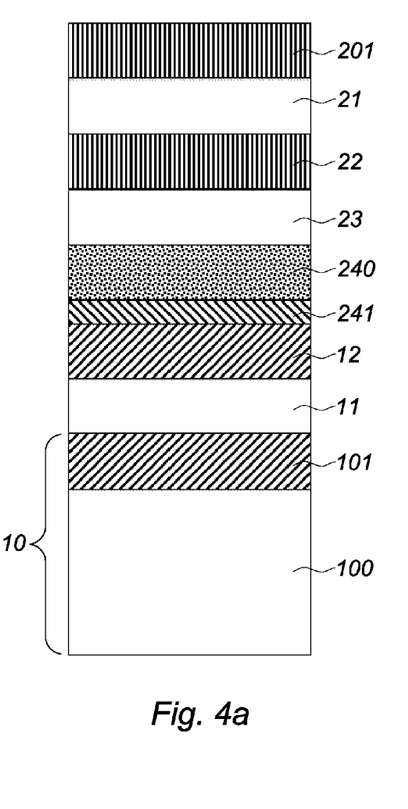
FIGS. 4a to 4e are schematic cross-sectional views illustrating steps of a method according to the invention, prior to formation of a ground plane by thermal activation of the dopants.
Figure 4B:
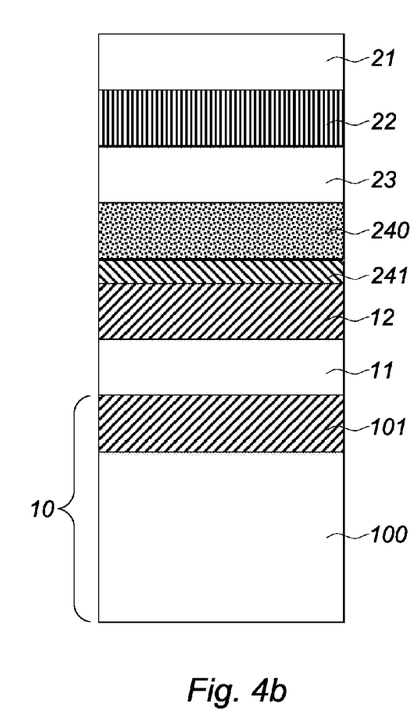
Figure 4C:
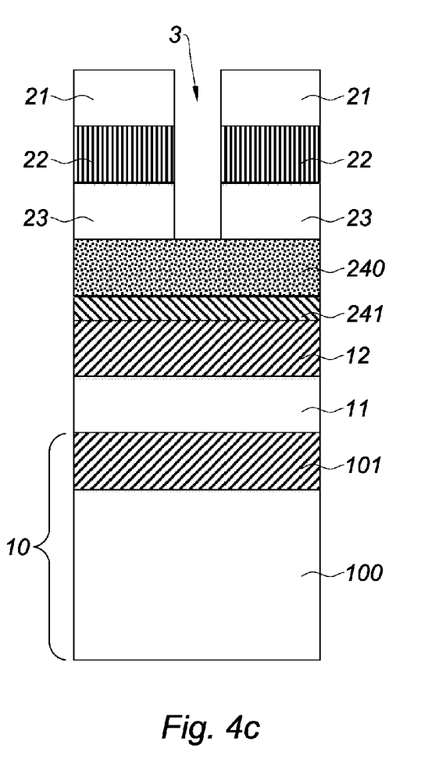

Advantageously, step e) previously comprises photolithography and etching steps 3 (cf. FIG. 4c) in the stack comprising the first semiconducting layer 23, intermediate layer 22, and active layer 21. The photolithography and etching steps 3 preferentially consist in forming first and second patterns within said stack. It is then possible to add p-type dopants in the first patterns, and n-type dopants in the second patterns. The ground plane, formed on completion of step f), then comprises p-doped areas and n-doped areas.

Figure 4D:
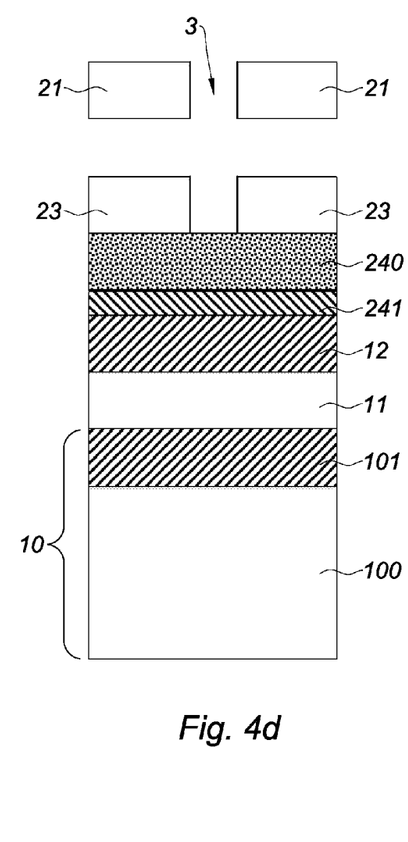
Figure 4E:
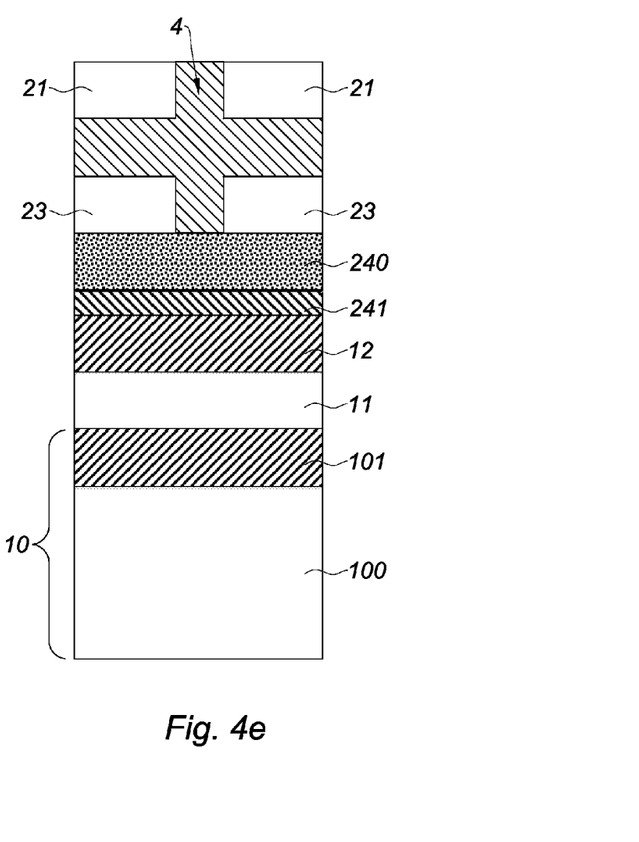

In addition, step e) advantageously previously comprises steps (illustrated in FIGS. 4d and 4e) consisting in removing the intermediate layer 22 provided in step b) and in replacing said intermediate layer 22 by a dielectric layer 4, preferentially a buried oxide layer. To do this, the intermediate layer 22 provided in step b) is etched after step d) in selective manner relatively to the active layer 21 and to the first semiconducting layer 23. Then a buried oxide layer 4 is formed instead of and in place of the intermediate layer 22 etched by means of a Silicon-On-Nothing (SON) technique.

Doping in the Active Layer

Figure 7A:
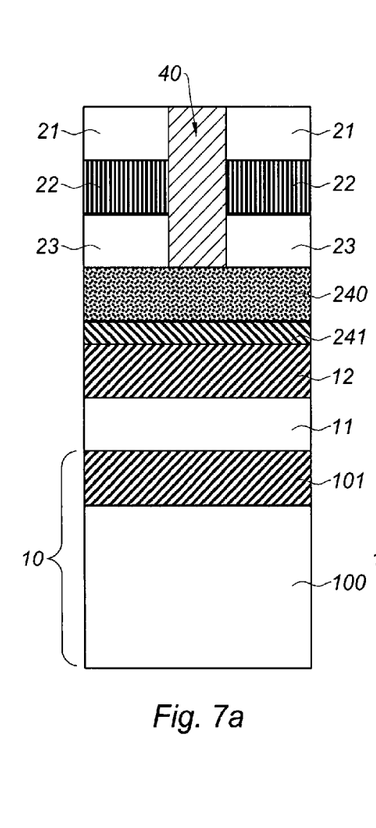
FIGS. 7a to 7e are schematic cross-sectional views illustrating steps of a method according to the invention, with formation of a transistor and doping in the active layer.
Figure 7B:
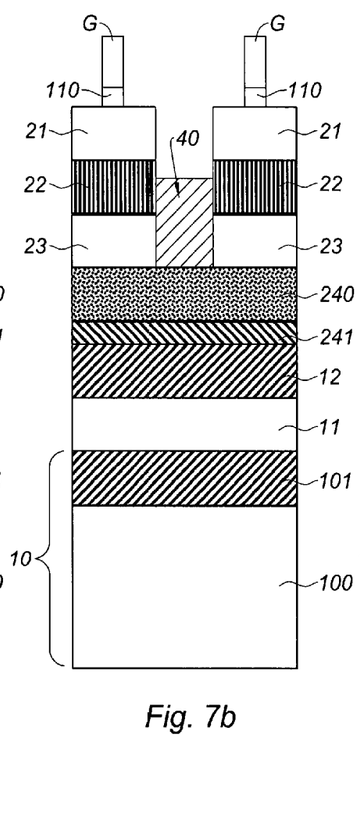
Figure 7C:
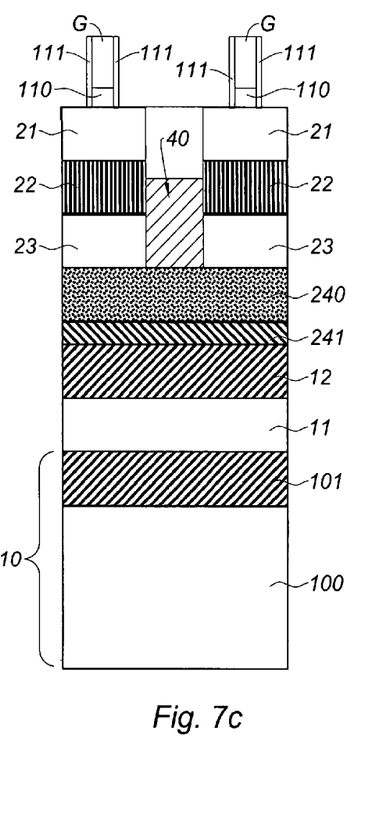
Figure 7D:
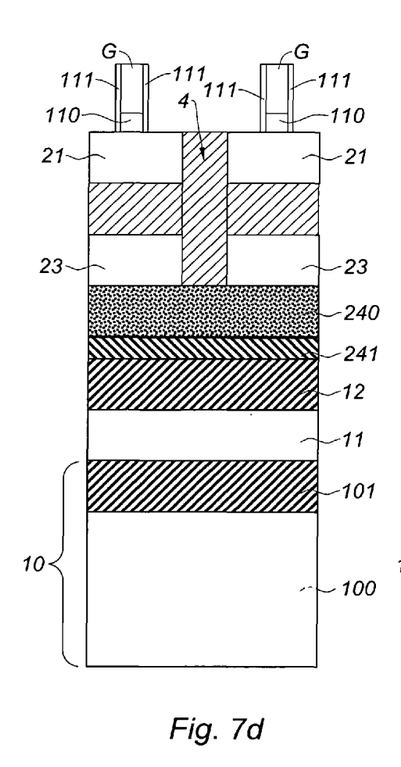

In case of doping in the active layer 21, step e) can comprise prior steps (illustrated in FIGS. 7a to 7e) consisting in forming a transistor from the active layer 21. The prior steps can thus consist in:

(i) performing shallow trench isolation STI, after step d), to form trenches in the stack comprising the first semiconducting layer 23, intermediate layer 22, and active layer 21, the STI trenches being formed at low temperature and filled with an oxide layer 40 (as illustrated in FIG. 7a);

(ii) forming gates G on the active layer 21 on each side of the shallow trench isolations (as illustrated in FIG. 7b), each gate G preferentially being formed on a gate oxide layer 110;

(iii) etching the oxide layer 40 so as to expose the intermediate layer 22 (as illustrated in FIG. 7b);

(iv) forming spacers 111 on the lateral edges of the gates G (as illustrated in FIG. 7c);

(v) removing the intermediate layer 22 provided in step b) and replacing said intermediate layer 22 by a dielectric layer 4, preferentially a buried oxide layer (as illustrated in FIG. 7d). To do this, the intermediate layer 22 provided in step b) is etched in selective manner relatively to the active layer 21 and to the first semiconducting layer 23. Then a buried oxide layer 4 is formed instead of and in place of the intermediate layer 22 etched by a Silicon-On-Nothing (SON) technique.

Figure 7E:
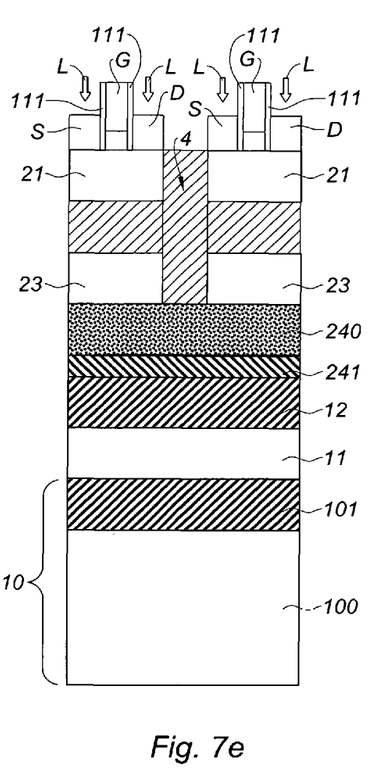

(vi) forming a source S and a drain D on each side of each gate G, preferably by epitaxy (as illustrated in FIG. 7e).

Then step e) consists in doping the areas of the active layer 21 formed by the sources S and drains D.

Thermal Activation of the Dopants

Figure 5:
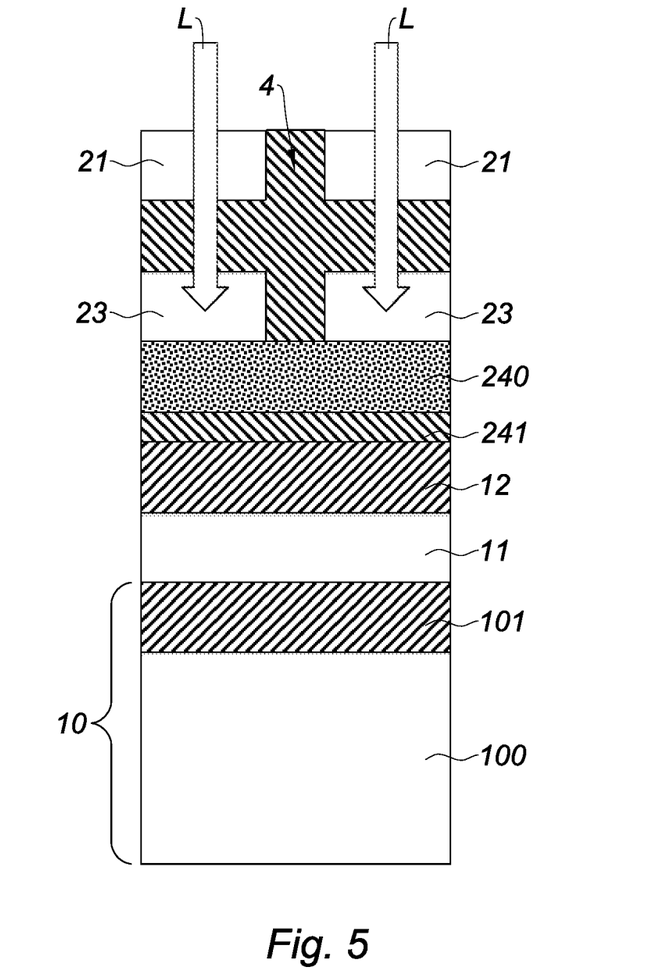
FIG. 5 is a schematic cross-sectional view illustrating thermal activation of the dopants by a pulse laser.

In case of doping in the first semiconducting layer 23, the fluence of the pulse laser L (for example from 0.1 to 1 J·cm$^{-2}$) and the pulse time (for example from 20 ns to 200 ns) are adjusted to the thicknesses of the active layer 21 and of the intermediate layer 22 in order to reach and thermally activate the dopants added to the first semiconducting layer 23 in step e). If the active layer 21 is covered by an oxide layer or if the thickness of the active layer 21 is increased, a possibility of adjusting the parameters is an increase of the fluence of the laser L.

In case of doping in the active layer 21, more precisely in the areas of the active layer 21 formed by the sources S and drains D, the fluence of the pulse laser L (for example from 0.1 to 1 J·cm$^{-2}$) and the pulse time (for example from 20 ns to 200 ns) are adjusted to the thickness of said areas of the active layer 21. If the active layer 21 is covered by an oxide layer or if the thickness of the active layer 21 is increased, a possibility of adjusting the parameters is an increase of the fluence of the laser L.

Interconnections, Stack Levels

Naturally, the first structure 1 can be provided with a set of electronic devices 11 extending on the substrate 10. The electronic devices are advantageously interconnected by metal lines.

The invention is not limited to the embodiments set out above. The person skilled in the art will be able to consider their technically operative combinations and to substitute equivalences for the latter.

The invention is thus not limited to two stack levels of electronic devices. It is quite possible to envisage at least a third stack level by reiterating the steps of the method after formation of the electronic device of the second structure from the active layer 21.

The invention is further not limited to a ground plane comprising first and second patterns respectively comprising p-type and n-type dopants The ground plane can also be uniform with a single dopant type; the photolithography and etching steps 3 will then have to be adapted accordingly.

The invention claimed is:
1. A method of fabricating a stack of electronic devices, comprising the following steps:

a) providing a first structure successively comprising a first substrate, a first electronic device, and a dielectric layer;
b) providing a second structure successively comprising a second substrate, an active layer designed to form a second electronic device, an intermediate layer, a first semiconducting layer designed to form a ground plane, and a porous second semiconducting layer;
c) bonding the first and second structures by direct bonding between the dielectric layer and the porous second semiconducting layer;
d) removing the second substrate of the second structure so as to expose the active layer;
e) adding dopants to the first semiconducting layer or the active layer;
f) irradiating the first semiconducting layer or the active layer by a pulse laser so as to thermally activate the dopants.

2. The method according to claim 1, wherein the porous second semiconducting layer presents a free surface in step b), and wherein step b) comprises a step $b_1$) consisting in forming a dielectric layer on said free surface, direct bonding being performed in step c) between the dielectric layer of the first structure and the dielectric layer formed in step $b_1$).

3. The method according to claim 2, wherein the dielectric layer formed in step $b_1$) is an oxide.

4. The method according to claim 1, wherein step b) is executed so that the porous second semiconducting layer presents a void ratio comprised between 20% and 80%.

5. The method according to claim 1, wherein the porous second semiconducting layer is made from porous silicon.

6. The method according to claim 1, wherein the porous second semiconducting layer presents a thickness comprised between 50 nm and 120 nm.

7. The method according to claim 1, wherein the second substrate of the second structure is made from semiconductor material.

8. The method according to claim 1, wherein the dielectric layer of the first structure is made from silicon dioxide.

9. The method according to claim 1, wherein the dielectric layer of the first structure presents a thickness of more than 60 nm.

10. The method according to claim 1, wherein the dopants added to the first semiconducting layer in step e) are selected from the group comprising B, In, P, and As.

11. The method according to claim 1, wherein the second structure provided in step b) comprises an etch stop layer inserted between the second substrate of the second structure and the active layer.

12. The method according to claim 11, wherein the etch stop layer is made from SiGe.

13. The method according to claim 1, wherein the intermediate layer provided in step b) is etched after step d) in a selective manner relatively to the active layer and to the first semiconducting layer; and a buried oxide layer is formed instead of and in place of the etched intermediate layer.

14. The method according to claim 13, wherein the intermediate layer provided in step b) is made from SiGe.

15. A method of fabricating a stack of electronic devices, comprising the following successive steps:
a) providing a first structure successively comprising a first substrate, a first electronic device, and a dielectric layer;
b) providing a second structure successively comprising a second substrate, an active layer designed to form a second electronic device, an intermediate layer, a first semiconducting layer designed to form a ground plane, and a porous second semiconducting layer;
c) bonding the first and second structures by direct bonding between the dielectric layer and the porous second semiconducting layer;
d) removing the second substrate of the second structure so as to expose the active layer;
e) adding dopants to the first semiconducting layer or the active layer;
f) irradiating the first semiconducting layer or the active layer by a pulse laser so as to thermally activate the dopants.

16. A method of fabricating a stack of electronic devices, comprising the following successive steps:
a) providing a first structure successively comprising a first substrate, a first electronic device, and a first dielectric layer;
b) providing a second structure successively comprising a second substrate, an active layer designed to form a second electronic device, an intermediate layer, a first semiconducting layer designed to form a ground plane, and a porous second semiconducting layer presenting a free surface;
$b_1$) forming a second dielectric layer on said free surface:
c) bonding the first and second structures by direct bonding between the first dielectric layer and the second dielectric layer;
d) removing the second substrate of the second structure so as to expose the active layer;
e) adding dopants to the first semiconducting layer or the active layer;
f) irradiating the first semiconducting layer or the active layer by a pulse laser so as to thermally activate the dopants.

* * * * *